US008120409B2

(12) United States Patent
Keskin et al.

(10) Patent No.: US 8,120,409 B2
(45) Date of Patent: Feb. 21, 2012

(54) PROGRAMMABLE DELAY CIRCUIT WITH INTEGER AND FRACTIONAL TIME RESOLUTION

(75) Inventors: Mustafa Keskin, San Diego, CA (US); Marzio Pedrali-Noy, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/962,045

(22) Filed: Dec. 20, 2007

(65) Prior Publication Data

US 2009/0160519 A1 Jun. 25, 2009

(51) Int. Cl.
*H03H 11/26* (2006.01)
(52) U.S. Cl. ........ 327/276; 327/158; 327/161; 327/277; 327/278; 327/285
(58) Field of Classification Search .................. 327/276, 327/277, 278, 285
See application file for complete search history.

(56) References Cited

U.S. PATENT DOCUMENTS

| 6,373,312 | B1 | 4/2002 | Barnes et al. | |
|---|---|---|---|---|
| 6,421,784 | B1 * | 7/2002 | Chu et al. | 713/401 |
| 6,759,884 | B2 * | 7/2004 | Tomita | 327/277 |
| 6,839,195 | B2 | 1/2005 | Chainer et al. | |
| 7,486,125 | B2 * | 2/2009 | Chae | 327/285 |
| 2005/0184775 | A1 | 8/2005 | Pilo et al. | |
| 2008/0224750 | A1 * | 9/2008 | Reddy | 327/276 |

FOREIGN PATENT DOCUMENTS

EP 0208049 A2 1/1987

OTHER PUBLICATIONS

International Search Report-PCT/US08/087545, International Search Authority-European Patent Office-Apr. 20, 2009.
Written Opinion-PCT/US08/087545, International Search Authority-European Patent Office-Apr. 20, 2009.

* cited by examiner

*Primary Examiner* — Lincoln Donovan
*Assistant Examiner* — John Poos
(74) *Attorney, Agent, or Firm* — Ramin Mobarhan (57) ABSTRACT

A programmable delay circuit capable of providing a delay with integer and fractional time resolution is described. In one exemplary design, an apparatus includes first and second delay circuits. The first delay circuit provides a first delay of an integer number of time units. The second delay circuit couples to the first delay circuit and provides a second delay of a fraction of one time unit. The first delay circuit may include multiple unit delay cells coupled in series. Each unit delay cell may provide a delay of one time unit when enabled. The second delay circuit may have first and second paths. The first path may provide a shorter delay when selected, and the second path may provide a longer delay when selected. The second path may be coupled to at least one dummy logic gate that provides extra loading to obtain the longer delay for the second path.

24 Claims, 5 Drawing Sheets

PROGRAMMABLE DELAY CIRCUIT WITH INTEGER AND FRACTIONAL TIME RESOLUTION

BACKGROUND

I. Field

The present disclosure relates generally to electronics circuits, and more specifically to a delay circuit.

II. Background

A synchronous circuit such as a flip-flop or a latch may receive a data signal from one source and a clock signal from another source. The data and clock signals may have different propagation delays and may not be time aligned at the synchronous circuit. It may be desirable to delay the clock signal and/or the data signal by a proper amount so that these signals are time aligned. This may then allow the synchronous circuit to operate at a faster rate and/or achieve more timing margins, both of which are desirable.

DETAILED DESCRIPTION

The word "exemplary" is used herein to mean "serving as an example, instance, or illustration." Any exemplary embodiment described herein as "exemplary" is not necessarily to be construed as preferred or advantageous over other exemplary embodiments.

The programmable delay circuit described herein may be used to match the delays of signals provided to synchronous circuits such as flip-flops, latches, etc. The programmable delay circuit may be used for interface circuits between different devices such as CPUs and memories, which may be implemented on the same integrated circuit (IC) or different ICs. The programmable delay circuit may also be used for internal circuits within a given device or IC.

Figure 1:
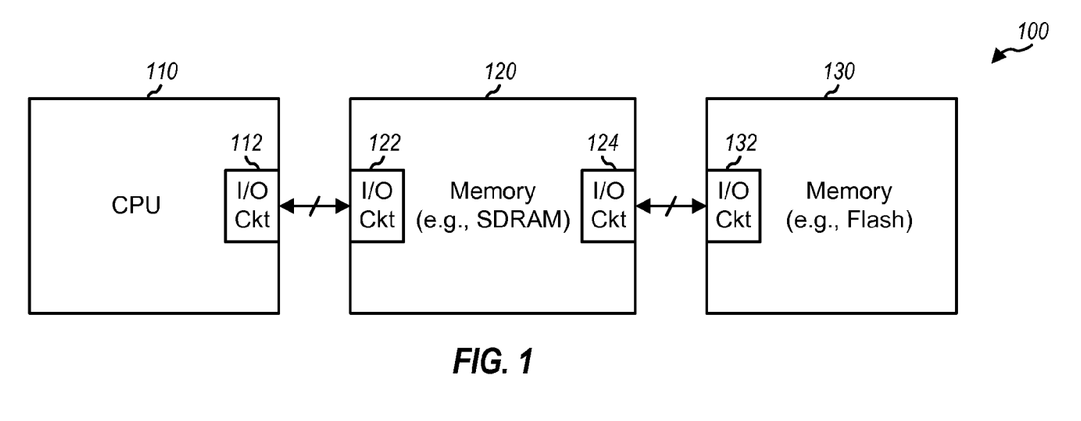
FIG. 1 shows a device having a central processing unit (CPU) and two memories.

FIG. 1 shows a block diagram of a device 100 having a CPU 110 and memories 120 and 130. CPU 110 may comprise any type of processor such as a digital signal processor (DSP), a general-purpose processor, a micro-processor, a reduced instruction set computing (RISC) processor, a complex instruction set computing (CISC) processor, etc. Memories 120 and 130 may be the same or different types of memories. For example, memory 120 may be a synchronous dynamic random access memory (SDRAM), and memory 130 may be a Flash memory such as a NAND Flash or a NOR Flash. CPU 110 and memories 120 and 130 may be implemented on a single IC such as an application specific integrated circuit (ASIC). Alternatively, CPU 110 and memories 120 and 130 may be implemented on separate ICs.

CPU 110 includes an input/output interface circuit (I/O Ckt) 112 for exchanging data with memory 120. Memory 120 includes I/O circuits 122 and 124 for exchanging data with CPU 110 and memory 130, respectively. Memory 130 includes an I/O circuit 132 for exchanging data with memory 120. It may be desirable to operate the interfaces between CPU 110 and memories 120 and 130 at clock rates that are as high as possible in order to improve data throughput. High clock rates may be supported by using the programmable delay circuit described herein in I/O circuits 112, 122, 124 and 132.

Figure 2:
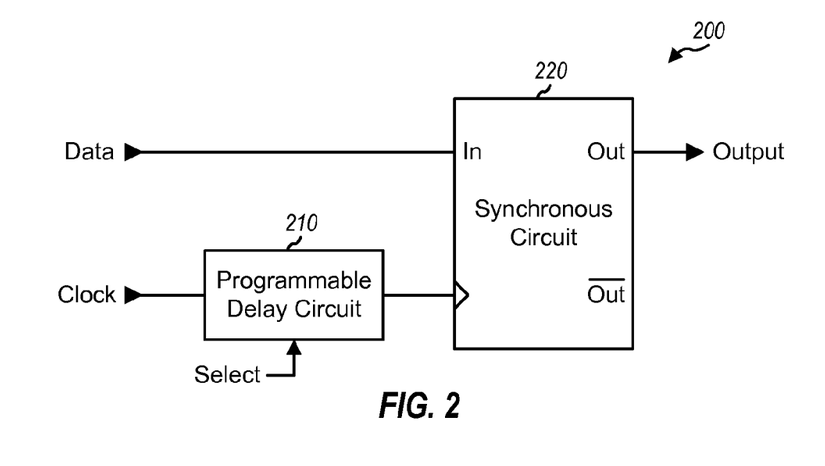
FIG. 2 shows a block diagram of an input interface circuit.

FIG. 2 shows a schematic diagram of an exemplary design of an input interface circuit 200, which may be used in each of the I/O circuits shown in FIG. 1. In this exemplary design, input interface circuit 200 includes a programmable delay circuit 210 and a synchronous circuit 220, which may comprise a flip-flop, a latch, etc. Programmable delay circuit 210 receives a clock signal and provides a delayed clock signal. Synchronous circuit 220 receives a data signal and the delayed clock signal and provides an output signal. Programmable delay circuit 210 provides a suitable amount of delay such that the delayed clock signal is time aligned with the data signal at the inputs of synchronous circuit 220. The amount of delay may be programmable and determined by a select control.

In an aspect, programmable delay circuit 210 can provide a delay with integer and fractional time resolution. Integer time resolution may be obtained with unit delay cells that can be efficiently implemented. Fractional time resolution may be efficiently obtained as described below. The fractional time resolution can provide finer delay resolution, which may allow the clock signal to be delayed or skewed with finer frequency resolution.

Figure 3:
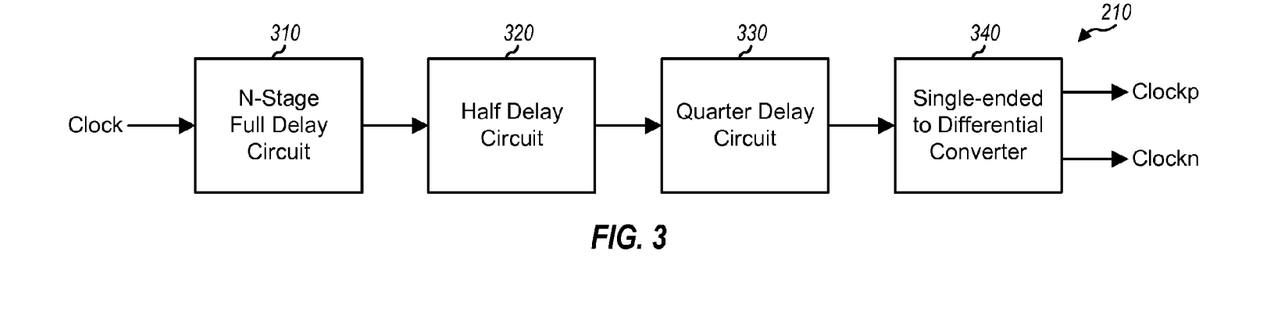
FIG. 3 shows a block diagram of a programmable delay circuit.

FIG. 3 shows a block diagram of an exemplary design of programmable delay circuit 210 in FIG. 2. In this exemplary design, programmable delay circuit 210 includes an N-stage full delay circuit 310, a half delay circuit 320, a quarter delay circuit 330, and a single-ended-to-differential converter 340, all of which are coupled in series. Full delay circuit 310 receives the clock signal and provides a delay of 1 to N time units, where N may be any integer value greater than one. A time unit $T_{unit}$ may be any suitable time duration and may be selected based on various factors such as the application for which programmable delay circuit 210 is used, the desired integer delay resolution, etc. For example, $T_{unit}$ may be on the order of picoseconds (ps), tens of picoseconds, etc. Half delay circuit 320 receives the output of full delay circuit 310 and provides a delay of one half time unit when enabled. Quarter delay circuit 330 receives the output of half delay circuit 320 and provides a delay of one quarter time unit when enabled. The combination of delay circuits 320 and 330 can provide a fractional delay of zero to $3T_{unit}/4$, plus a time offset described below.

Delay circuits 310, 320 and 330 may be arranged in different orders than the order shown in FIG. 3. Furthermore, one or more additional fractional delay circuits (e.g., an eighth delay circuit, a sixteenth delay circuit, etc.) may be used to provide even finer delay resolution. Single-ended-to-differential converter 340 receives a single-ended signal from the last delay circuit 330, performs single-ended to differential conversion, and provides a differential delayed clock signal Clockp and Clockn.

Figure 4:
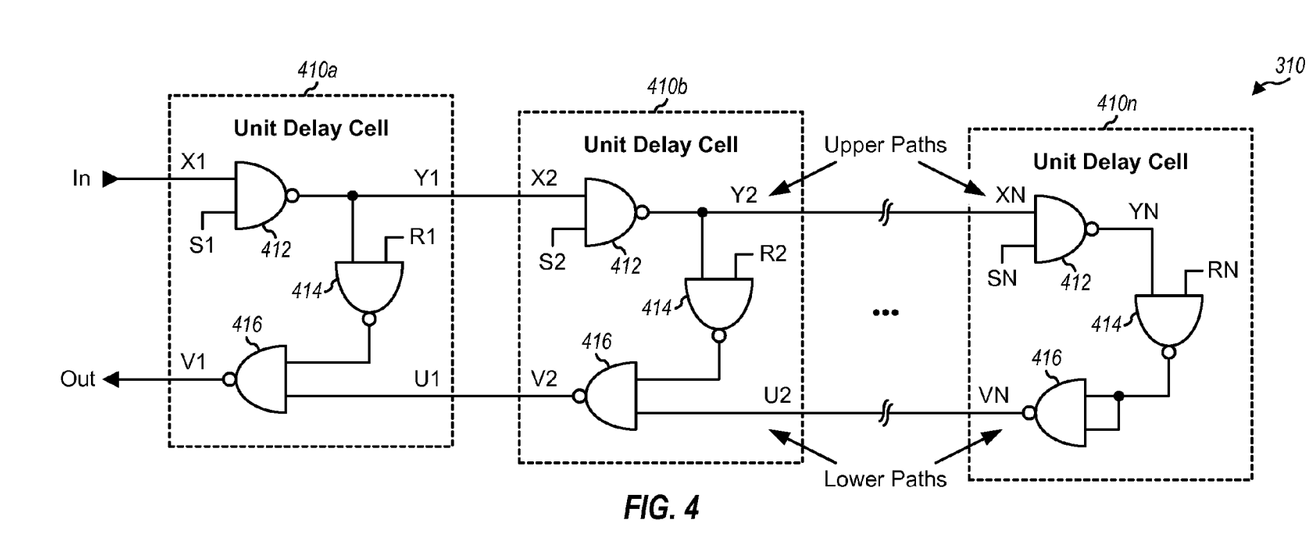
FIG. 4 shows a schematic diagram of an N-stage full delay circuit.

FIG. 4 shows a schematic diagram of an exemplary design of N-stage full delay circuit 310 in FIG. 3. In this exemplary design, full delay circuit 310 includes N unit delay cells 410a through 410n coupled in series. Unit delay cells 410a through 410n may be enabled in a sequential order based on control signals S1 and R1 through SN and RN to obtain the desired amount of delay. For example, a delay of $T_{unit}$ may be obtained by enabling only unit delay cell 410a, a delay of 2T$_{unit}$ may be obtained by enabling two unit delay cells 410a and 410b, and so on, and a delay of N·T$_{unit}$ may be obtained by enabling all N unit delay cells 410a through 410n.

Each unit delay cell 410 includes (i) an upper path composed of a NAND gate 412 and (ii) a lower path composed of a NAND gate 416. Each unit delay cell 410 further includes a NAND gate 414 for coupling an output signal from the upper path to the lower path. For the n-th unit delay cell, where $1 \leq n \leq N$, NAND gate 412 receives an input signal Xn for the upper path and a control signal Sn and provides an output signal Yn for the upper path. NAND gate 414 receives the output signal Yn and a control signal Rn and provides its output to NAND gate 416. NAND gate 416 receives an input signal Un for the lower path and the output of NAND gate 414 provides an output signal Vn for the lower path.

Each unit delay cell 410 operates as follows. NAND gate 412 passes (i) the input signal Xn if the control signal Sn is at logic high or (ii) logic high if the control signal Sn is at logic low. NAND gate 414 passes (i) the output signal Yn if the control signal Rn is at logic high or (ii) logic high if the control signal Rn is at logic low. NAND gate 416 passes (i) the output of NAND gate 414 if the control signal Rn is at logic high or (ii) the input signal Un for the lower path if the control signal Rn is at logic low. Table 1 gives the output signal Yn for the upper path and the output signal Vn for the lower path versus control signals Sn and Rn, respectively.

TABLE 1

| Sn | Yn | Rn | Vn |
|---|---|---|---|
| 0 | logic high | 0 | Yn |
| 1 | $\overline{Xn}$ | 1 | $\overline{Un}$ |

Each unit delay cell 410 receives an output signal Yn−1 from the upper path of a preceding unit delay cell, delays this signal by a delay of $T_{half-unit} = T_{unit}/2$, and provides an output signal Yn to the upper path of the next unit delay cell if enabled by the control signal Sn. Each unit delay cell 410 also passes the output signal Yn from the upper path to the lower path via NAND gate 414 if enabled by the control signal Rn. Each unit delay cell 410 further receives an output signal Vn+1 from the lower path of the next unit delay cell, passes the signal Yn or Vn+1 based on the control signal Rn, delays the passed signal by a delay of $T_{half-unit}$, and provides an output signal Vn to the lower path of the preceding unit delay cell.

A delay of k·T$_{unit}$, where $1 \leq k \leq N$ may be obtained by passing the input signal through the upper paths of the first k unit delay cells, then from the upper path to the lower path of the k-th unit delay cell, and then through the lower paths of the first k unit delay cells. This may be achieved by (i) setting control signals S1 through Sk to logic high to enable the first k unit delay cells, (ii) setting the remaining control signals Sk+1 through SN to logic low to disable the remaining N−k unit delay cells, (iii) setting control signal Rk to logic high to pass the signal from the upper path to the lower path of the k-th unit delay cell, and (iv) setting the N−1 remaining control signals R1 through Rk−1 and Rk+1 through RN to logic low.

The total delay provided by full delay circuit 310 may be expressed as:

$$T_{integer} = 2 \cdot k \cdot T_{half-unit} + T_{offset} = k \cdot T_{unit} + T_{offset} \quad \text{Eq (1)}$$

where $T_{offset}$ is the delay of the coupling path from the upper path to the lower path, k is the number of unit delay cells selected, and $T_{integer}$ is the total delay provided by full delay circuit 310.

As shown in equation (1), the total delay includes a portion $T_{offset}$ that is present regardless of the number of unit delay cells selected. $T_{offset}$ may thus be considered as a fixed offset. The total delay may be selected in increments of $T_{unit}$ by enabling a proper number of unit delay cells.

In the exemplary design shown in FIG. 4, each unit delay cell has one NAND gate 412 in the upper path, one NAND gate 416 in the lower path, and one NAND gate 414 in the coupling path from the upper path to the lower path. When k unit delay cells are selected, where $1 \leq k \leq N$ the input signal passes through 2k NAND gates in the upper and lower paths of the k selected unit delay cells plus one NAND gate in the coupling path of the k-th unit delay cell. The input signal thus passes through an odd number of NAND gates regardless of the number of unit delay cells selected. An inverter may be inserted at either the input or the output of the first unit delay cell 410a (not shown in FIG. 4) in order to obtain an even number of inversions. This would result in the output signal having the same polarity as the input signal. Alternatively, the inversion by this inverter may be achieved by swapping the Clockp and Clockn signals from converter 340 in FIG. 3.

Figure 5:
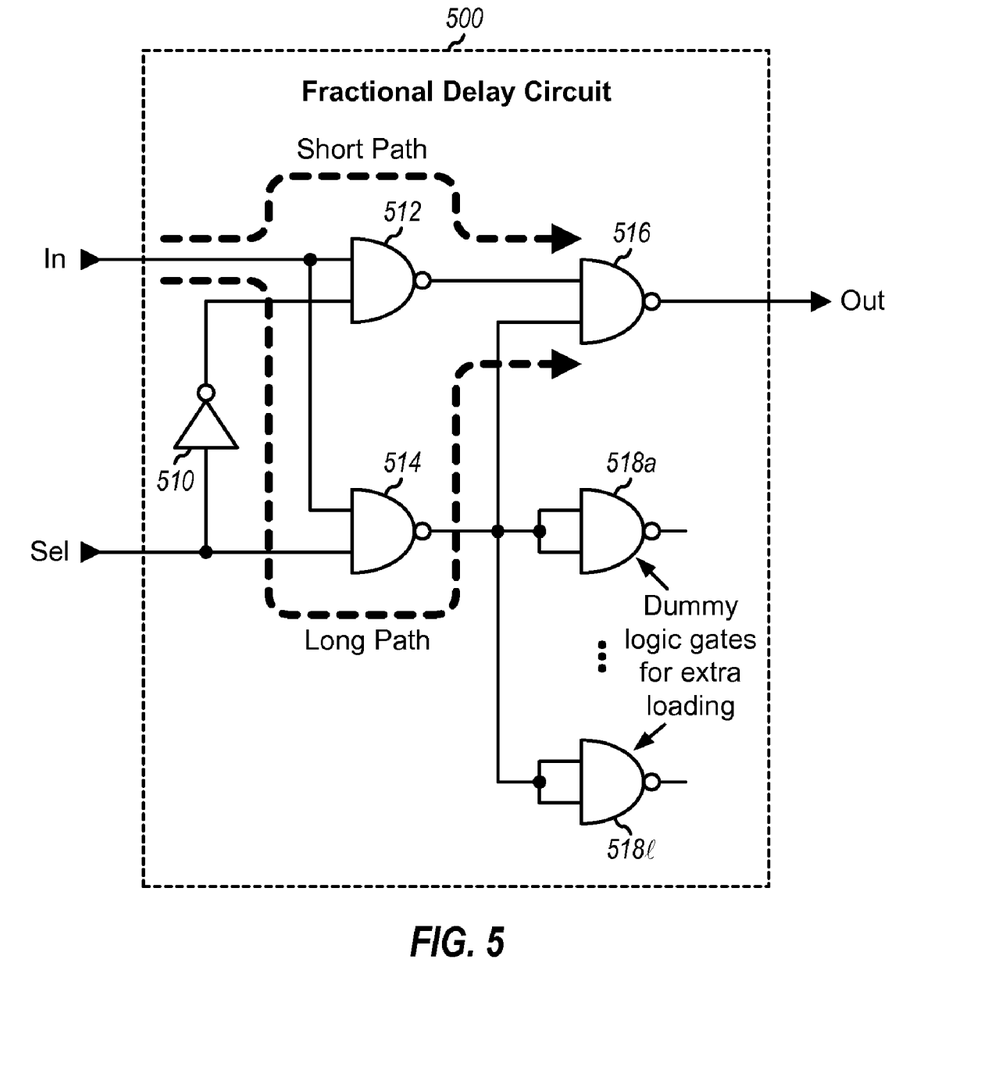
FIG. 5 shows a schematic diagram of a fractional delay circuit.

FIG. 5 shows a schematic diagram of an exemplary design of a fractional delay circuit 500, which may be used for each of delay circuits 320 and 330 in FIG. 3. Fractional delay circuit 500 includes an inverter 510, three NAND gates 512, 514 and 516, and L dummy NAND gates 518a through 518l, where in general $L \geq 1$. Inverter 510 receives a control signal Sel and provides an inverted control signal. NAND gate 512 receives an input signal Iin and the inverted control signal, and NAND gate 514 receives the input signal and the control signal. NAND gate 516 receives the outputs of NAND gates 512 and 514 and provides an output signal Out. NAND gates 518a through 518l have their inputs coupled together and further to the output of NAND gate 514.

Fractional delay cell 500 includes a short path composed of NAND gates 512 and 516 and a long path composed of NAND gates 514 and 516. The short path is selected when the control signal Sel is at logic low. In this case, the input signal passes through NAND gates 512 and 516 to the output. The long path is selected when the control signal Sel is at logic high. In this case, the input signal passes through NAND gates 514 and 516 to the output.

The fractional delay provided by delay circuit 500 may be expressed as:

$$T_{frac} = T_{long} - T_{short}, \quad \text{Eq (2)}$$

where $T_{short}$ is the delay of the short path, $T_{long}$ is the delay of the long path, and $T_{frac}$ is the fractional delay provided by delay circuit 500 when selected.

The delay through fractional delay circuit 500 includes a portion $T_{short}$ that is present regardless of whether or not delay circuit 500 is selected. $T_{short}$ may thus be considered as a fixed offset.

NAND gates 518a through 518l act as dummy gates that provide extra loading for NAND gate 514 and hence increase the propagation delay of the long path. NAND gates 518 may be designed to provide the desired fractional delay $T_{frac}$. In one exemplary design, different numbers of NAND gates 518 may be used to obtain different amounts of fractional delay. For example, a fractional delay of $T_{unit}/8$ may be obtained with one NAND gate, a fractional delay of $T_{unit}/4$ may be obtained with two NAND gates, and a fractional delay of $T_{unit}/2$ may be obtained with four NAND gates. In another exemplary design, only one NAND gate 518a may be used as the dummy gate, but the dimension (e.g., width and/or length) of the transistors within NAND gate 518a may be selected to obtain the desired fractional delay. Computer simulations indicate that the delay of the long path increases linearly with the width of the transistors for dummy NAND gate 518*a*. The desired fractional delay may thus be obtained by selecting a suitable width for the transistors within dummy NAND gate 518*a*.

Fractional delay circuit 500 may be used for half delay circuit 320 in FIG. 3. In this case, NAND gates 518*a* through 518*l* may be designed to provide a fractional delay of $T_{unit}/2$ when half delay circuit 320 is selected. Fractional delay circuit 500 may also be used for quarter delay circuit 330 in FIG. 3. In this case, NAND gates 518*a* through 518*l* may be designed to provide a fractional delay of $T_{unit}/4$ when quarter delay circuit 330 is selected. In general, fractional delay circuit 500 may be designed to provide any desired fractional delay.

Figure 6:
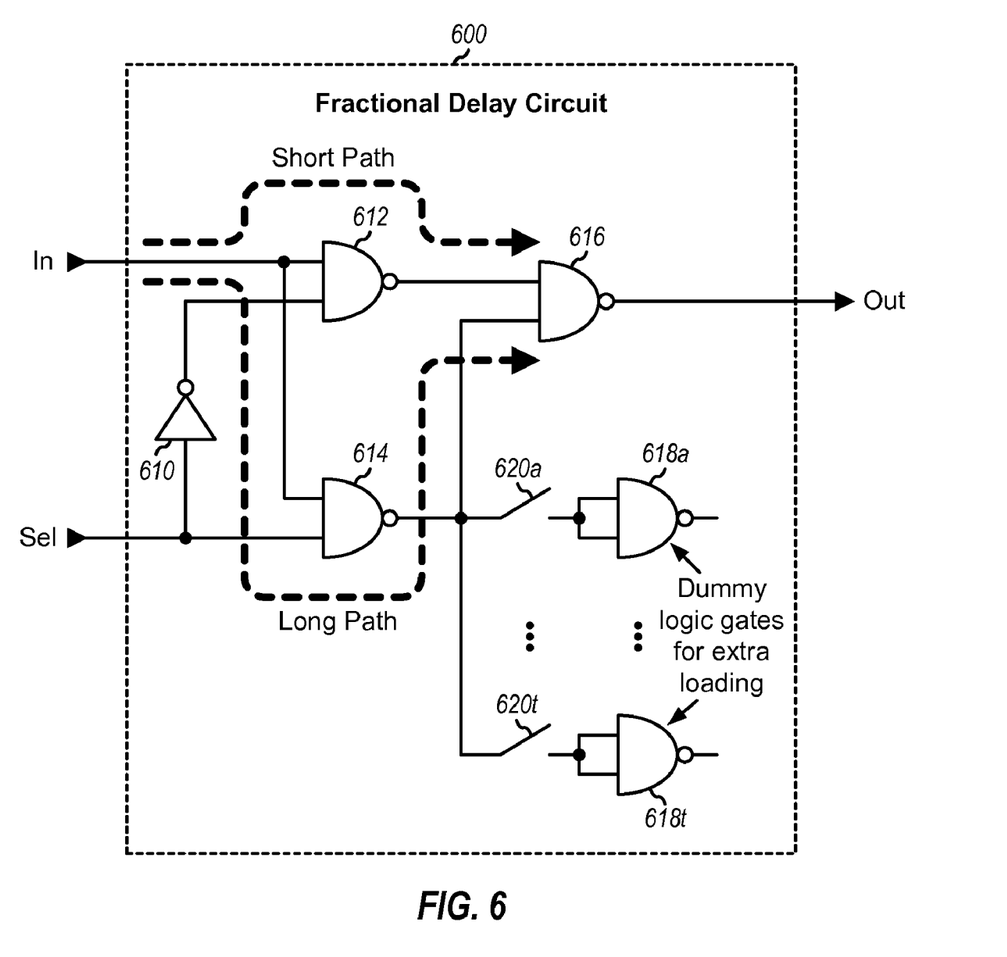
FIG. 6 shows a schematic diagram of another fractional delay circuit.

FIG. 6 shows a schematic diagram of an exemplary design of a fractional delay circuit 600, which may be used for both of delay circuits 320 and 330 in FIG. 3. Fractional delay circuit 600 includes an inverter 610 and three NAND gates 612, 614 and 616 that are coupled in the same manner as inverter 510 and NAND gates 512, 514 and 516 in FIG. 5. Fractional delay circuit 600 further includes multiple (T) dummy NAND gates 618*a* through 618*t* coupled to the output of NAND gate 614 via T switches 620*a* through 620*t*, respectively. Each dummy NAND gate 618 has its inputs coupled together and to the output of NAND gate 614 via a respective switch 620.

In one exemplary design, the T dummy NAND gates 618*a* through 618*t* have the same size. The number of dummy NAND gates 618 to couple to the output of NAND gate 614 is determined by the desired fractional delay. For example, one, two, or four dummy NAND gates 618 may be coupled to the output of NAND gate 614 to obtain fractional delays of $T_{unit}/8$, $T_{unit}/4$, or $T_{unit}/2$, respectively. In another exemplary design, different dummy NAND gates have different transistor dimensions, and a proper dummy NAND gate may be coupled to the output of NAND gate 614 based on the desired fractional delay.

In the exemplary designs shown in FIGS. 5 and 6, NAND gates are used for the logic gates in the short and long paths as well as for the dummy logic gates that provide extra loading in the long path. In general, the extra loading may be obtained with any type of logic gate, e.g., AND gates, OR gates, NOR gates, exclusive OR (XOR) gates, inverters, etc. The extra loading may also be obtained with transistors and/or other circuit elements. It may be desirable to implement the dummy logic gates using the same type of logic gate used in the short and long paths. This may allow the dummy logic gates to be fabricated using the same IC process used for the logic gates in the short and long paths. This may also provide a more accurate fractional delay across IC process, temperature, and power supply variations.

The programmable delay circuit described herein may be used to delay clock signals to time align the clock signals with data signals for synchronous circuits such as flip-flops, latches, etc. The programmable delay circuit may be used in high-speed interface circuits (e.g., as shown in FIG. 1) to time align the data and clock signals. These high-speed interface circuits may be for CPUs, memories, registers of programmable blocks, etc. The programmable delay circuit may also be used for internal circuits where accurate delay matching of clock/control signals and data signals is desired.

The programmable delay circuit described herein may be used for various applications such as communication, networking, computing, consumer electronics, etc. The programmable delay circuit may be used for cellular phones, personal digital assistants (PDAs), wireless communication devices, handheld devices, wireless modems, laptop computers, cordless phones, etc. An example use of the programmable delay circuit in a wireless communication device is described below.

Figure 7:
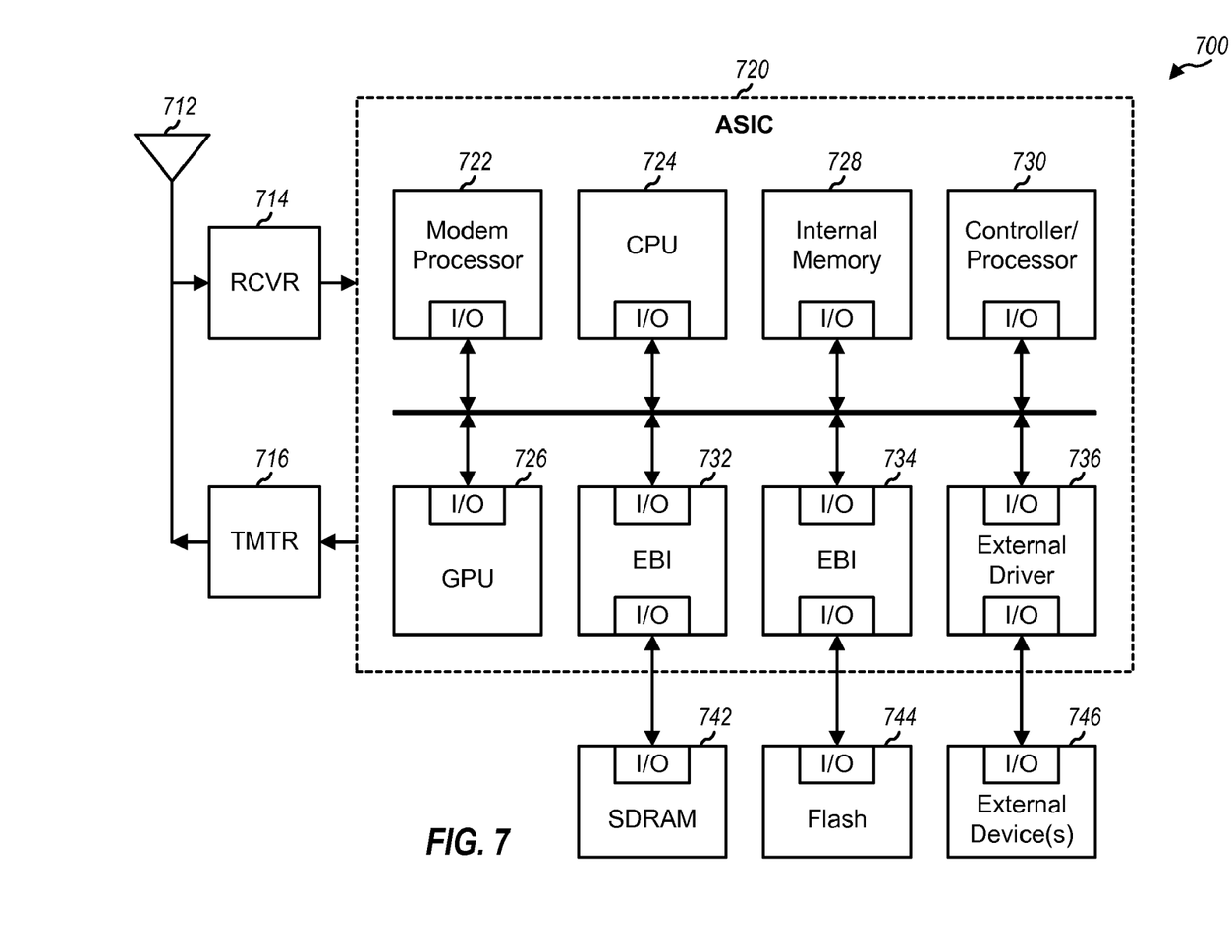
FIG. 7 shows a block diagram of a wireless communication device.

FIG. 7 shows a block diagram of an exemplary design of a wireless communication device 700 in a wireless communication system. Wireless device 700 may be a cellular phone, a terminal, a handset, a PDA, etc. The wireless communication system may be a Code Division Multiple Access (CDMA) system, a Global System for Mobile Communications (GSM) system, etc.

Wireless device 700 is capable of providing bi-directional communication via a receive path and a transmit path. In the receive path, signals transmitted by base stations (not shown) are received by an antenna 712 and provided to a receiver (RCVR) 714. Receiver 714 conditions the received signal and provides an input signal to an ASIC 720. In the transmit path, a transmitter (TMTR) 716 receives and conditions an output signal from ASIC 720 and generates a modulated signal, which is transmitted via antenna 712 to the base stations.

ASIC 720 may include various processing, interface, and memory units such as, e.g., a modem processor 722, a CPU 724, a graphics processing unit (GPU) 726, an internal memory 728, a controller/processor 730, external bus interfaces (EBIs) 732 and 734, and an external driver 736. Modem processor 722 may perform processing for data transmission and reception, e.g., encoding, modulation, demodulation, decoding, etc. CPU 724 may perform various types of processing for wireless device 700, e.g., processing for higher layer applications. GPU 726 may perform graphics and video processing for wireless device 700. Internal memory 728 may store data and/or instructions for various units within ASIC 720. Controller/processor 730 may direct the operation of various processing and interface units within ASIC 720. EBI 732 may facilitate transfer of data between ASIC 720 and an SDRAM 742. EBI 734 may facilitate transfer of data between ASIC 720 and a Flash memory 744. External driver 736 may drive external device(s) 746 via an analog or digital interface. The programmable delay circuit described herein may be implemented in any of the processing, memory and interface units shown in FIG. 7, e.g., in any of the I/O circuits (I/O) shown in FIG. 7.

The programmable delay circuit described herein may be implemented in various hardware units such as DSPs, digital signal processing devices (DSPDs), programmable logic devices (PLDs), field programmable gate arrays (FPGAs), processors, controllers, micro-controllers, microprocessors, electronics devices, memory devices, etc. The programmable delay circuit may be used in various types of IC such as ASICs, digital ICs, analog ICs, mixed-signal ICs, radio frequency ICs (RFICs), etc. The programmable delay circuit may be fabricated with various IC process technologies such as complementary metal oxide semiconductor (CMOS), N-channel MOS (N-MOS), P-channel MOS (P-MOS), bipolar junction transistor (BJT), bipolar CMOS (BiCMOS), silicon germanium (SiGe), gallium arsenide (GaAs), etc. The programmable delay circuit may also be fabricated with any device size technology, e.g., 130 nanometers (nm), 90 nm, 65 nm, 45 nm, 32 nm, etc.

An apparatus implementing the programmable delay circuit described herein may be a stand-alone device or may be part of a larger device. A device may be (i) a stand-alone IC, (ii) a set of one or more ICs that may include memory ICs for storing data and/or instructions, (iii) an ASIC such as a mobile station modem (MSM), (iv) an RFIC such as an RF receiver (RFR) or an RF transmitter/receiver (RTR), (v) a module that may be embedded within other devices, (vi) a cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first delay circuit providing a first delay of an integer number of time units; and
a second delay circuit coupled in series with the first delay circuit and providing a second delay of a fraction of one time unit selected from separate delay paths with different delays based on loading and a common output.

2. The apparatus of claim 1, the second delay circuit comprising
a first path providing a shorter delay when the first path is selected,
a second path providing a longer delay when the second path is selected, and
at least one dummy logic gate coupled to the second path and providing extra loading to obtain the longer delay for the second path.

3. The apparatus of claim 2, the first path comprising first and second logic gates, the second path comprising the second logic gate and a third logic gate, and the at least one dummy logic gate being coupled to the third logic gate.

4. The apparatus of claim 3, the at least one dummy logic gate being same type of logic gate as the first, second and third logic gates.

5. The apparatus of claim 2, the at least one dummy logic gate being defined such that a difference between the longer delay and the shorter delay is equal to the fraction of one time unit.

6. The apparatus of claim 1, the second delay circuit comprising
a first path providing a shorter delay when the first path is selected,
a second path providing a longer delay when the second path is selected, and
multiple dummy logic gates coupled to the second path and providing extra loading to obtain the longer delay for the second path.

7. The apparatus of claim 6, the multiple dummy logic gates being selectable to obtain different longer delays for the second path.

8. The apparatus of claim 1, the second delay circuit providing the second delay with a resolution of one half time unit.

9. The apparatus of claim 1, the second delay circuit providing the second delay with a resolution of one quarter time unit.

10. The apparatus of claim 1, the second delay circuit comprising
a third delay circuit providing a delay of one half time unit when enabled.

11. The apparatus of claim 10, the second delay circuit further comprising
a fourth delay circuit coupled to the third delay circuit and providing a delay of one quarter time unit when enabled.

12. The apparatus of claim 1, the first delay circuit comprising
multiple unit delay cells coupled in series, each unit delay cell providing a delay of one time unit when enabled.

13. An integrated circuit comprising:
a first delay circuit providing a first delay of an integer number of time units; and
a second delay circuit coupled in series with the first delay circuit and providing a second delay of a fraction of one time unit selected from separate delay paths with different delays based on loading and a common output.

14. The integrated circuit of claim 13, the second delay circuit comprising
a first path providing a shorter delay when the first path is selected,
a second path providing a longer delay when the second path is selected, and
at least one dummy logic gate coupled to the second path and providing extra loading to obtain the longer delay for the second path.

15. The integrated circuit of claim 13, the second delay circuit comprising
a third delay circuit providing a delay of one half time unit when enabled.

16. The integrated circuit of claim 15, the second delay circuit further comprising
a fourth delay circuit coupled to the third delay circuit and providing a delay of one quarter time unit when enabled.

17. An integrated circuit comprising:
a first set of logic gates forming a first path for an input signal and providing a shorter delay;
a second set of logic gates forming a second path for the input signal and providing a longer delay, the first path and the second path with different delays and a common output; and
at least one dummy logic gate coupled to the second set of logic gates and providing extra loading to obtain the longer delay for the second path, the at least one dummy logic gate being same type of logic gate as the first and second sets of logic gates.

18. The integrated circuit of claim 17, the first set of logic gates comprising first and second logic gates coupled in series, the second set of logic gates comprising a third logic gate and the second logic gate coupled in series, and the at least one dummy logic gate being coupled to an output of the third logic gate.

19. The integrated circuit of claim 17, the at least one dummy logic gate being implemented with transistors having a predetermined dimension, and the number of dummy logic gates being determined based on a target difference between the longer delay and the shorter delay.

20. The integrated circuit of claim 17, the first and second sets of logic gates and the at least one dummy logic gate being NAND gates.

21. A method comprising:
delaying an input signal by a first delay of an integer number of time units; and
delaying the input signal further by a second delay coupled in series with the first delay, the second delay of a fraction of one time unit selected from separate delay paths with different delays based on loading and a common output based on extra loading provided by at least one dummy logic gate.

22. The method of claim 21, the delaying the input signal further by the second delay comprising
passing the input signal via a first path without the extra loading if the second delay is not selected, and
passing the input signal via a second path with the extra loading if the second delay is selected.

23. An apparatus comprising:
- means for delaying an input signal by a first delay of an integer number of time units; and
- means for delaying the input signal further by a second delay second delay coupled in series with the first delay, the second delay of a fraction of one time unit selected from separate delay paths with different delays based on loading and a common output based on extra loading provided by at least one dummy logic gate.

24. The apparatus of claim 23, the means for delaying the input signal further by the second delay comprising
- means for passing the input signal via a first path without the extra loading if the second delay is not selected, and
- means for passing the input signal via a second path with the extra loading if the second delay is selected.

* * * * *